US011547028B2

(12) United States Patent
Jung et al.

(10) Patent No.: US 11,547,028 B2
(45) Date of Patent: Jan. 3, 2023

(54) DISPLAY DEVICE

(71) Applicant: LG ELECTRONICS INC., Seoul (KR)

(72) Inventors: Jaeyong Jung, Seoul (KR); Kangwook Jung, Seoul (KR); Jihwan Hyun, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 17/173,979

(22) Filed: Feb. 11, 2021

(65) Prior Publication Data

US 2021/0337700 A1 Oct. 28, 2021

(30) Foreign Application Priority Data

Apr. 27, 2020 (KR) .................... 10-2020-0050773

(51) Int. Cl.
*H05K 7/20* (2006.01)
*H01L 51/52* (2006.01)

(52) U.S. Cl.
CPC ......... *H05K 7/2099* (2013.01); *H01L 51/529* (2013.01)

(58) Field of Classification Search
CPC ............................ H05K 7/2099; H01L 51/529
See application file for complete search history.

(56) References Cited

U.S. PATENT DOCUMENTS

| 5,383,340 | A | 1/1995 | Larson et al. |
| 6,097,597 | A | 8/2000 | Kobayashi |
| 2004/0009353 | A1* | 1/2004 | Knowles ............. H01L 23/3733 257/E23.101 |
| 2016/0341486 | A1* | 11/2016 | Kim ....................... H01L 23/427 |
| 2017/0118859 | A1* | 4/2017 | Kang .................... H05K 7/1427 |
| 2018/0143673 | A1 | 5/2018 | Jenkins et al. |
| 2018/0263138 | A1 | 9/2018 | Wu et al. |
| 2019/0003775 | A1 | 1/2019 | Lin |

FOREIGN PATENT DOCUMENTS

| JP | 2019032134 | 2/2019 |
| KR | 1020150091905 | 8/2015 |
| KR | 1020190060074 | 6/2019 |

OTHER PUBLICATIONS

European Patent Office Application Serial No. 21156473.7, Search Report dated Jul. 21, 2021, 8 pages.
Korean Intellectual Property Office Application No. 10-2020-0050773, Office Action dated Sep. 8, 2021, 4 pages.

* cited by examiner

*Primary Examiner* — Mukundbhai G Patel
(74) *Attorney, Agent, or Firm* — Lee, Hong, Degerman, Kang & Waimey PC

(57) ABSTRACT

A display device is disclosed. The display device includes a display panel, a vapor chamber positioned behind the display panel, a board, which is positioned behind the vapor chamber and is coupled to the vapor chamber, and an adhesive member disposed between the display panel and the vapor chamber so as to be coupled thereto, wherein the vapor chamber includes a first plate, which defines a front surface thereof and faces the display panel, a second plate, which defines a rear surface thereof and is coupled to the first plate, and fluid flowing in a space defined between the first plate and the second plate, and wherein the first plate includes a coupler, which is depressed rearwards from the first plate and to which the adhesive member is coupled.

14 Claims, 10 Drawing Sheets

DISPLAY DEVICE

CROSS-REFERENCE TO RELATED APPLICATION

Pursuant to 35 U.S.C. § 119(a), this application claims the benefit of earlier filing date and right of priority to Korean Patent Application No. 10-2020-0050773, filed on Apr. 27, 2020, the contents of which are hereby incorporated by reference herein in its entirety.

BACKGROUND OF THE INVENTION

1. Field of the Invention

The present disclosure relates to a display device.

2. Description of the Related Art

With the development of information society, demand for various kinds of display devices is increasing. In response to this demand, various kinds of display devices, such as LCDs (Liquid Crystal Display Devices), PDPs (Plasma Display Panels), ELDs (Electroluminescent Displays), VFDs (Vacuum Fluorescent Displays) and OLEDs (Organic Light-Emitting Diodes) have been recently researched and used.

An OLED panel is configured to display an image by depositing a self-luminescent organic layer on a substrate having a transparent electrode formed thereon. The OLED panel is capable of having not only a decreased thickness but also flexibility. Furthermore, because a display device employing the OLED panel does not require a backlight unit, there is an advantage of realizing an ultra-slim display device.

In an ultra-slim display device having a large screen, research on a structure capable of efficiently removing heat generated due to display of a high-definition image on the screen has been intensively conducted.

SUMMARY OF THE INVENTION

Therefore, the present disclosure has been made in view of the above problems, and it is an object of the present disclosure to provide a display device capable of preventing the temperature of a display panel from being excessively increased.

Another object of the present disclosure is to provide a vapor chamber capable not only of cooling the display panel but also of ensuring the desired rigidity of the display device.

Still another object of the present disclosure is to provide a display device capable of minimizing the distance between the vapor chamber and the display panel to allow heat generated from the display panel to be easily transmitted to the vapor chamber.

Yet another object of the present disclosure is to provide a display device capable of allowing the fluid evaporated from the region of the vapor chamber, into which a relatively large amount of heat is absorbed, to quickly flow to the heat radiation portion so as to efficiently cool the display panel.

In accordance with an aspect of the present disclosure, the above and other objects can be accomplished by the provision of a display device including a display panel, a vapor chamber positioned behind the display panel, a board, which is positioned behind the vapor chamber and is coupled to the vapor chamber, and an adhesive member disposed between the display panel and the vapor chamber so as to be coupled thereto, wherein the vapor chamber includes a first plate, which defines a front surface thereof and faces the display panel, a second plate, which defines a rear surface thereof and is coupled to the first plate, and fluid flowing in a space defined between the first plate and the second plate, and wherein the first plate includes a coupler, which is depressed rearwards from the first plate and to which the adhesive member is coupled.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE PREFERRED EMBODIMENTS

A description will now be given in detail according to exemplary embodiments disclosed herein with reference to the accompanying drawings. For the sake of brevity of description with reference to the drawings, the same or equivalent components are denoted by the same reference numbers, and a description thereof will not be repeated.

In general, suffixes such as "module" and "unit" may be used to refer to elements or components. The use of such suffixes herein is merely intended to facilitate description of the specification, and the suffixes do not have any special meaning or function.

In the present disclosure, that which is well known to one of ordinary skill in the relevant art has generally been omitted for the sake of brevity. The accompanying drawings are used to facilitate understanding of various technical features, and it should be understood that the embodiments presented herein are not limited by the accompanying drawings. As such, the present disclosure should be construed to extend to any alterations, equivalents and substitutes, in addition to those that are particularly set out in the accompanying drawings.

It is to be understood that, although the terms "first," "second," etc. may be used herein to describe various elements, these elements are not limited by these terms. These terms are only used to distinguish one element from another.

It will be understood that when an element is referred to as being "connected with" another element, intervening elements may be present. In contrast, it will be understood that when an element is referred to as being "directly connected with" another element, there are no intervening elements present.

A singular representation may include a plural representation unless the context clearly indicates otherwise.

In the present application, it should be understood that the terms "comprises," "includes," "has," etc. specify the presence of features, numbers, steps, operations, elements, components, or combinations thereof described in the specification, but do not preclude the presence or addition of one or more other features, numbers, steps, operations, elements, components, or combinations thereof.

Figure 1:
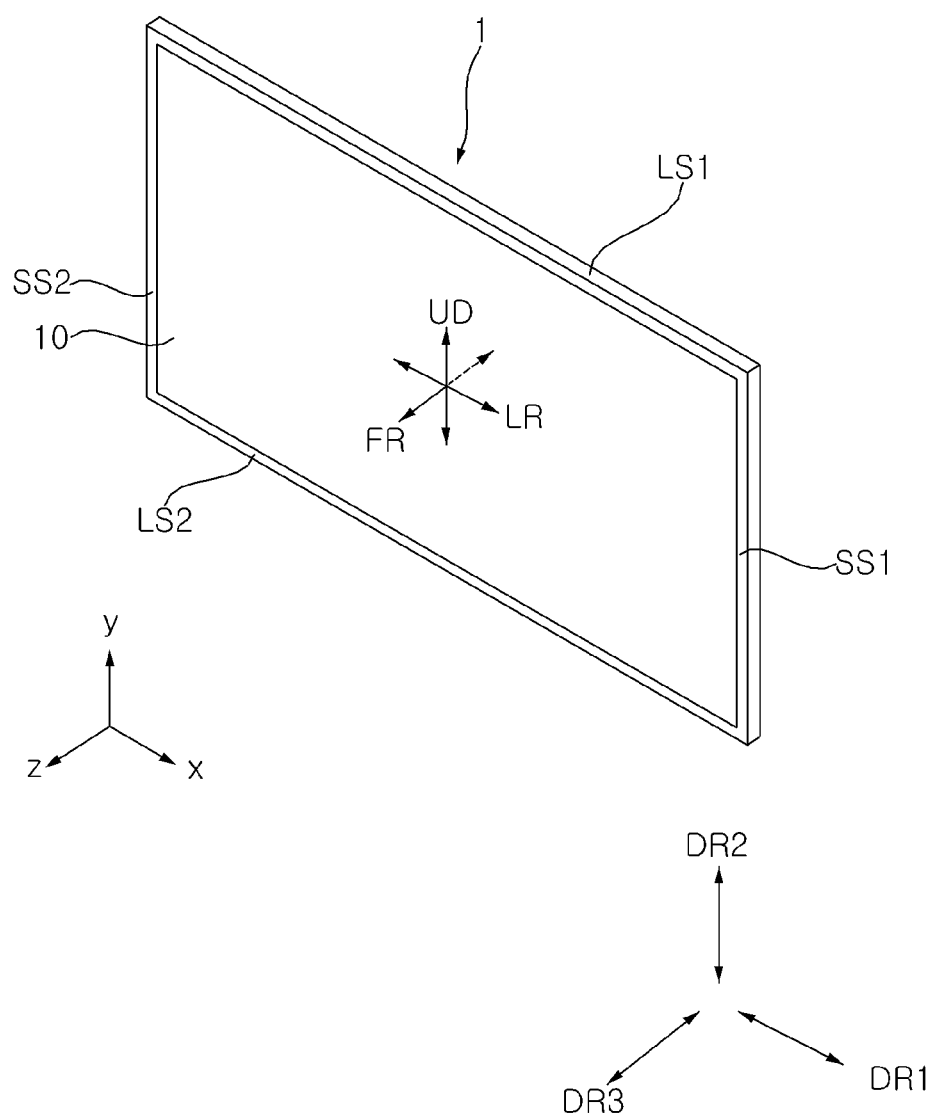
FIGS. 1 to 10 are views illustrating display devices according to embodiments of the present disclosure.

Referring to FIG. 1, the display device 1 may include a display panel 10. The display panel 10 may display a screen.

The display device 1 may include a first long side LS1, a second long side LS2, which faces the first long side LS1, a first short side SS1 adjacent to first ends of the first long side LS1 and the second long side LS2, and a second short side SS2, which faces the first short side SS1. Although each of the first and second long sides LS1 and LS2 is illustrated and described as being longer than each of the first and second short sides SS1 and SS2 for convenience of explanation, the length of each of the first and second long sides LS1 and LS2 may be almost the same as that of each of the first and second short sides SS1 and SS2.

A direction parallel to the first and second long sides LS1 and LS2 of the display device 1 may be referred to as a first direction DR1 or a lateral direction LR. A direction parallel to the first and second short sides SS1 and SS2 of the display device 1 may be referred to as a second direction DR2 or a vertical direction UD. A direction perpendicular to the first and second long sides LS1 and LS2 and the first and second short sides SS1 and SS2 of the display device 1 may be referred to as a third direction DR3 or an anteroposterior direction FR. Here, the direction in which the display panel 10 displays an image may be referred to as a forward direction, and the direction opposite the forward direction may be referred to as a rearward direction.

Figure 2:
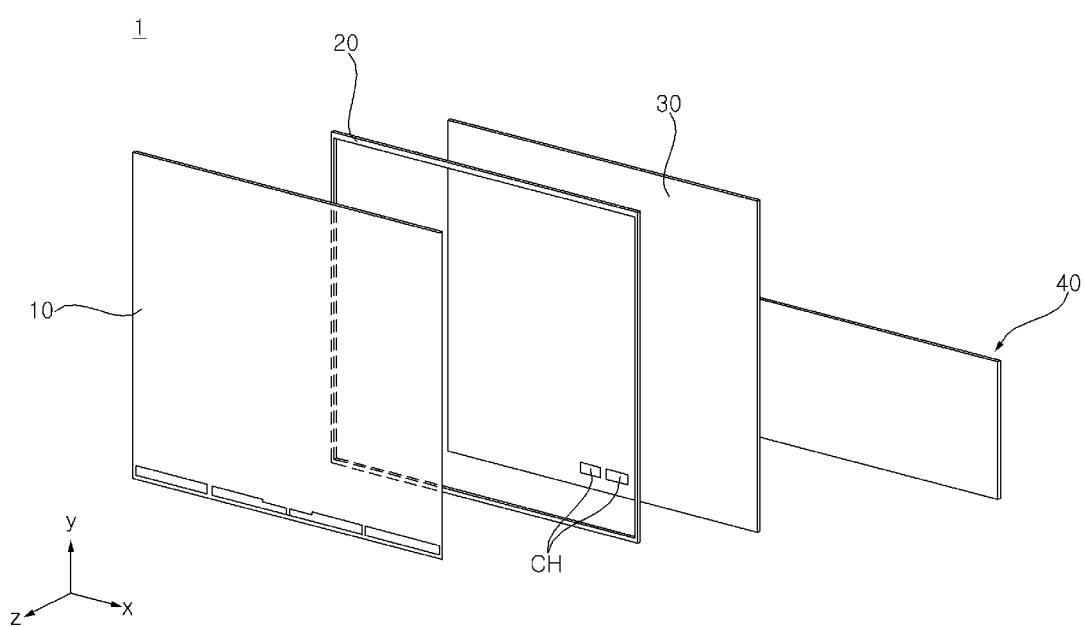

Referring to FIGS. 1 and 2, the display device 1 may include the display panel 10, a frame 20, a vapor chamber 30, and a back cover 40.

The display panel 10 may define the front surface of the display device 1, and may display an image on the front surface of the display device 1. For example, the display panel 10 may be an OLED (Organic Light-Emitting Diode) panel. The display panel 10 may divide an image into a plurality of pixels, and may control the color, brightness and chroma of each of the pixels, thereby outputting the image. The display panel 10 may be divided into an active area, in which an image is displayed, and an inactive area, in which an image is not displayed. The display panel 10 may generate light corresponding to red, green or blue in response to a control signal.

The frame 20 may define the side surface of the device 1. The frame 20 may be positioned behind the display panel 10, and may be coupled to the display panel 10. The frame 20 may extend along the edge of the display panel 10. The frame 20 may have a rectangular ring shape overall. For example, the frame 20 may include a metal material. For example, the frame 20 may be made of aluminum (Al). Meanwhile, the frame 20 may also be referred to as a side frame, a middle frame, a middle cabinet or a panel guide. Meanwhile, it is also possible to realize an embodiment in which the frame 20 is omitted from the display device 1 and in which the display panel 10 or the vapor chamber 30 defines the side surface of the display device 1.

The vapor chamber 30 may be positioned behind the display panel 10. The vapor chamber 30 may be coupled to the display panel 10. The vapor chamber 30 may cover the entire area or a portion of the rear surface of the display panel 10. The vapor chamber 30 may increase the torsional rigidity and/or the bending rigidity of the display device 1. For example, the vapor chamber 30 may include a metal material. For example, the vapor chamber 30 may include stainless steel. Here, the vapor chamber 30 may be referred to as a module cover or a main frame.

Furthermore, the vapor chamber 30 may prevent the temperature of the display panel 10 from excessively increasing during operation of the display device 1. A detailed description thereof will be given later.

The back cover 40 may be positioned behind the vapor chamber 30. The back cover 40 may be coupled to the vapor chamber 30. The back cover 40 may be coupled to the vapor chamber 30 via a coupler (not shown) formed at the vapor chamber 30. For example, the coupler may be a PEM nut. The back cover 40 may cover at least a portion of the rear surface of the vapor chamber 30. The back cover 40 may define at least a portion of the rear surface of the display device 1. Meanwhile, it is also possible to realize an embodiment in which the back cover 40 is omitted from the display device 1 and the vapor chamber 30 or a sheet coupled to the vapor chamber 30 defines the rear surface of the display device 1.

Figure 3:
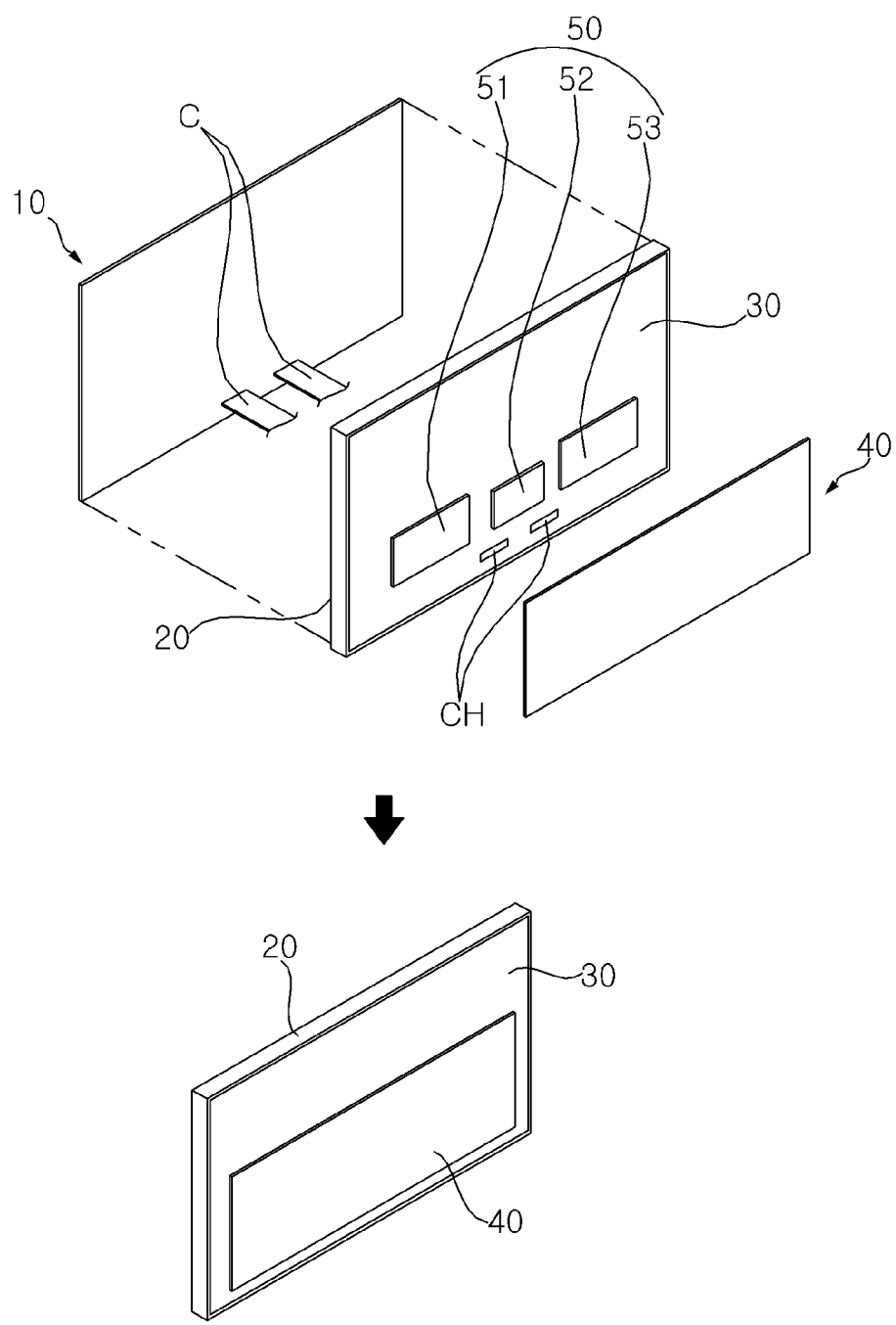

Referring to FIG. 3, a board 50 may be coupled to the vapor chamber 30 from the rear side of the vapor chamber 30. A plurality of electronic elements may be disposed at the board 50. In other words, when current flows through the plurality of electronic elements disposed at the board 50, heat may be generated in the electronic elements. Here, the board 50 may be a PCB (Printed Circuit Board).

For example, the board 50 may include a plurality of boards, which are electrically connected to respective components of the display device 1. For example, the board 50 may include a power supply board 51 for supplying power to the individual components of the display device 1, a timing controller board 52 for providing an image signal to the display panel 10, and a main board 53 for controlling the individual components of the display device 1.

The display panel 10 and the vapor chamber 30 coupled to the frame 20 may be close to each other in the anteroposterior direction FR so as to be assembled into the display device 1.

Specifically, a source PCB (not shown) may be coupled to the rear surface of the display panel 10 adjacent to the lower side of the display panel 10. The source PCB may be electrically connected both to the display panel 10 and to a cable C. The cable C may be electrically connected to the timing controller board 52 so as to transmit digital video data and a timing control signal to the source PCB from the timing controller board 52. For example, the cable C may be guided rearwards through a cable hole CH formed in the vapor chamber 30, and may be connected to the timing controller board 52. Here, the cable C may be an FFC (Flexible Flat Cable). The lower end of the vapor chamber 30 may be positioned higher than the position at which the cable C is coupled to the display panel such that the cable C is connected to the timing controller board 52 without forming the cable hole CH in the vapor chamber 30.

The display panel 10 may be coupled to the frame 20 and/or the vapor chamber 30. The back cover 40 may be coupled to the vapor chamber 30 so as to cover the rear side of the board 50. For example, the display panel 10 and the vapor chamber 30 may be configured to be the same size. For example, the size of the back cover 40 may correspond to the size of the area on the vapor chamber 30 in which the board 50 is positioned. In other words, the back cover 40 may have a size that is smaller than the size of the vapor chamber 40 but is sufficient to cover the rear side of the board 50.

Figure 4:
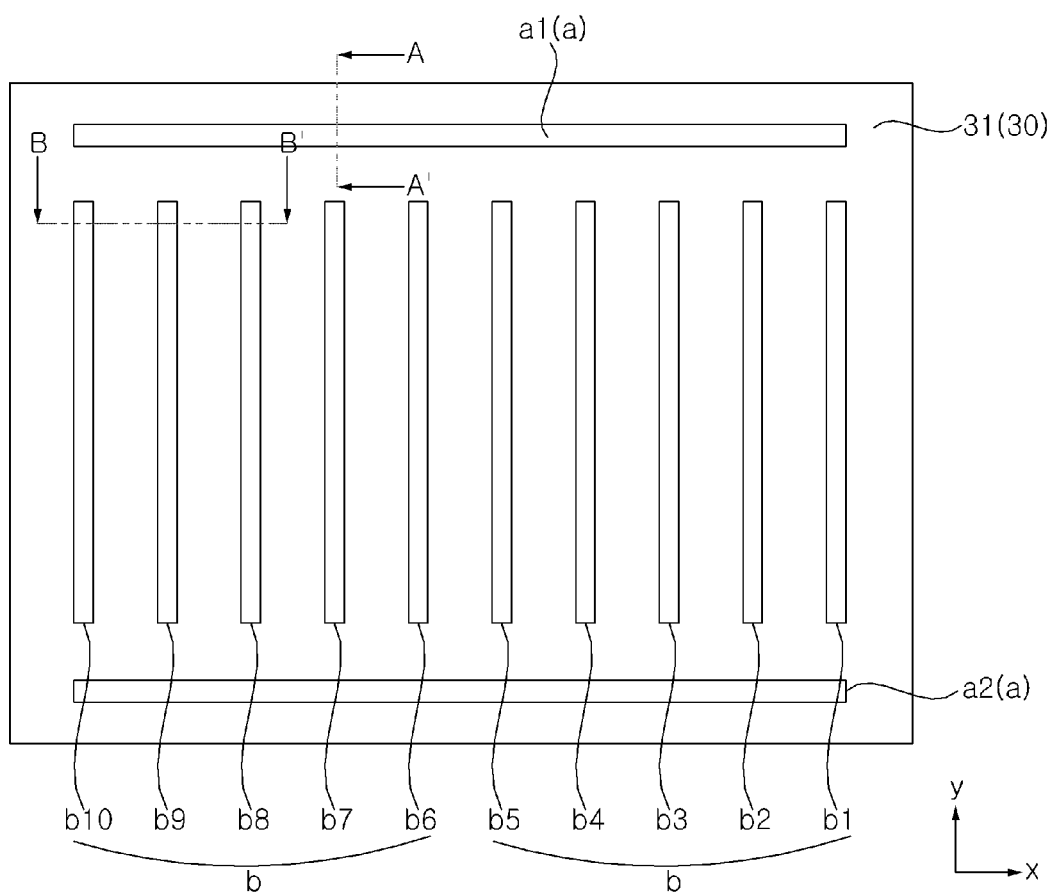

Referring to FIG. 4, adhesive members a and b may be disposed between the display panel 10 and the vapor chamber 30 so as to couple the display panel 10 and the vapor chamber 30 to each other. For example, the adhesive members a and b may include a plurality of adhesive members. The adhesive members a and b may include a horizontal adhesive member a and a vertical adhesive member b.

The horizontal adhesive member a may include a plurality of horizontal adhesive members a1 and a2, which extend in the lateral direction LR adjacent to the upper and lower sides of the vapor chamber 30. The vertical adhesive member b may include a plurality of vertical adhesive members b1 to b9, which extend in the vertical direction UD between the right side and the left side of the vapor chamber 30.

For example, the adhesive members a and b may be pieces of double-sided adhesive tape. For example, the adhesive members may include a phase change material (PCM). In this case, the adhesive members a and b may serve as adhesive while absorbing or radiating ambient heat using the latent heat thereof. In order words, because the adhesive members a and b have excellent heat conductivity, the heat generated from the display panel 10 may be easily transmitted to the vapor chamber 30.

Figure 5:
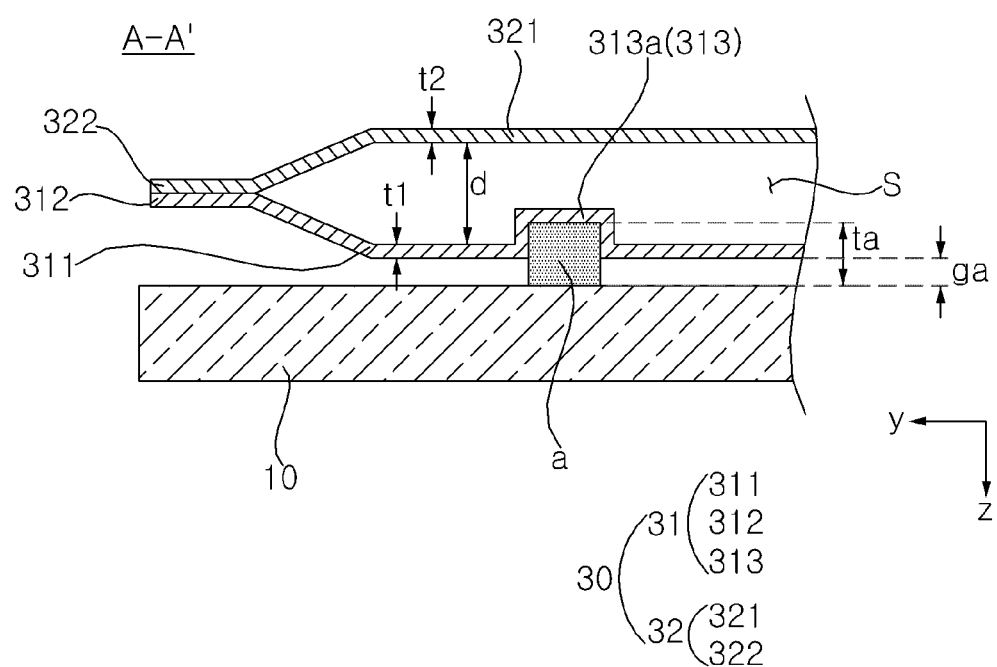

Referring to FIGS. 4 and 5, the vapor chamber 30 may include a first plate 31, a second plate 32, and fluid W (not shown).

The first plate 31 may define the front surface of the vapor chamber 30, and may face the display panel 10. The first plate 31 may include a first body 311, which is flat overall with respect to the display panel 10. The second plate 32 may define the rear surface of the vapor chamber 30, and may be coupled to the first plate 31. The second plate 32 may include a second body 321, which is flat overall with respect to the display panel 10. The thickness t1 of the first body 311 may be the same as the thickness t2 of the second body 321.

For example, the first plate 31 may include a first flange 312, which is formed along the periphery of the first body 311. The second plate 32 may include a second flange 322, which is formed along the periphery of the second body 321. The first flange 312 may be bent rearwards at least once and the second flange 322 may be bent forwards at least once such that a portion of the first flange 312 and a portion of the second flange 322 come into contact with each other. In this case, the first flange 312 and the second flange 322 may be coupled to each other through a process such as welding.

The fluid W may flow in the space S defined between the first plate 31 and the second plate 32. Specifically, the first body 311 of the first plate 31 may be spaced apart from the second body 321 of the second plate 32 by a predetermined distance d so as to define a space S therebetween. For example, the fluid W may be water. Here, the first plate 31 and the second plate 32 may include highly corrosion-resistant stainless steel.

The heat generated from the display panel 10 or the board 50 during operation of the display device 1 may be transmitted to the vapor chamber 30 so as to evaporate the fluid W. The fluid W having the increased temperature may move upwards, and may condense while radiating heat to the outside. The condensed fluid W moves downwards. Accordingly, because evaporation and condensation of the fluid W are repeatedly performed, it is possible to cool the components of the display device 1 including the display panel 10 and the board 50.

Considering that the fluid W having a relatively high temperature tends to move upwards, it is preferable that portions of the vapor chamber 30 having a relatively high temperature be positioned lower than portions of the vapor chamber 30 having a relatively low temperature.

Figure 6:
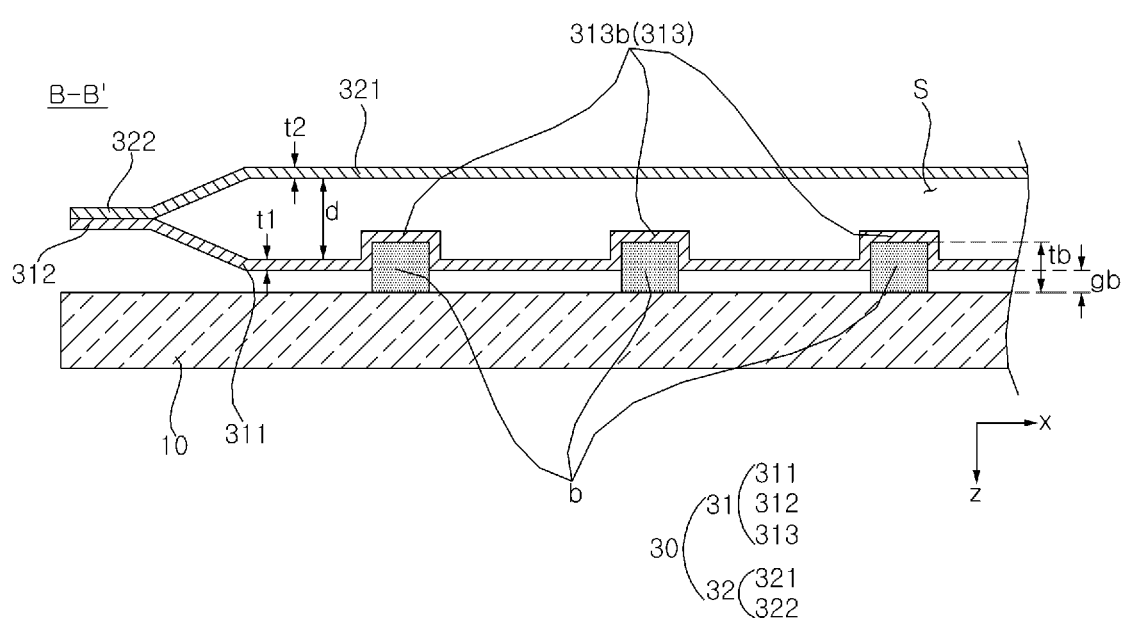

Referring to FIGS. 5 and 6, the first plate 31 may include couplers 313, which are depressed rearwards from the first plate 31 and to which the adhesive members a and b are coupled. For example, the couplers 313 may be formed through a process such as forming, forging or half piercing. The couplers 313 may include a horizontal coupler 313a and a vertical coupler 313b.

Referring to FIG. 5, the horizontal coupler 313a may be depressed rearwards from the first body 311, and may be coupled to the horizontal adhesive member a. For example, the front surface of the first body 311 may be positioned between the front surface and the rear surface of the horizontal adhesive member a so as to be spaced apart from the rear surface of the display panel 10 by a first distance ga. Here, the first distance ga may be smaller than the thickness ta of the horizontal adhesive member a. Alternatively, the front surface of the first body 311 may be flush with the front surface of the horizontal adhesive member a so as to be in contact with the rear surface of the display panel 10.

Referring to FIG. 6, the vertical coupler 313b may be depressed rearwards from the first body 311, and may be coupled to the vertical adhesive member b. For example, the front surface of the first body 311 may be positioned between the front surface and the rear surface of the vertical adhesive member b so as to be spaced apart from the rear surface of the display panel 10 by a second distance gb. Here, the first distance gb may be smaller than the thickness tb of the vertical adhesive member b. Alternatively, the front surface of the first body 311 may be flush with the front surface of the vertical adhesive member b so as to be in contact with the rear surface of the display panel 10.

Here, the thickness ta of the horizontal adhesive member a may be the same as the thickness tb of the vertical adhesive member b, and the first distance ga may be the same as the second distance gb. Consequently, the first body 311 may be positioned so as to be flat overall with respect to the display panel 10.

Accordingly, because the adhesive members a and b are coupled to the couplers 313, the front surface of the first body 311 may be positioned close to, or may be in contact with, the rear surface of the display panel 10. As a result, the distance between the front surface of the display panel 10 and the rear surface of the vapor chamber 30, that is, the thickness of the display device 1, may decrease.

Furthermore, the heat generated from the display panel 10 may be easily transmitted to the vapor chamber 30. In other words, since the size of the air gap between the display panel 10 and the first plate 31 is reduced compared to the a case in which the region of the first body 311 to which the adhesive members a and b are coupled is flat, it is possible to prevent the temperature of the display panel 10 from excessively increasing during the operation of the display device 1. Accordingly, it is possible to prevent image retention on the display panel 10 and reduction of service life of the display panel 10.

Figure 7:
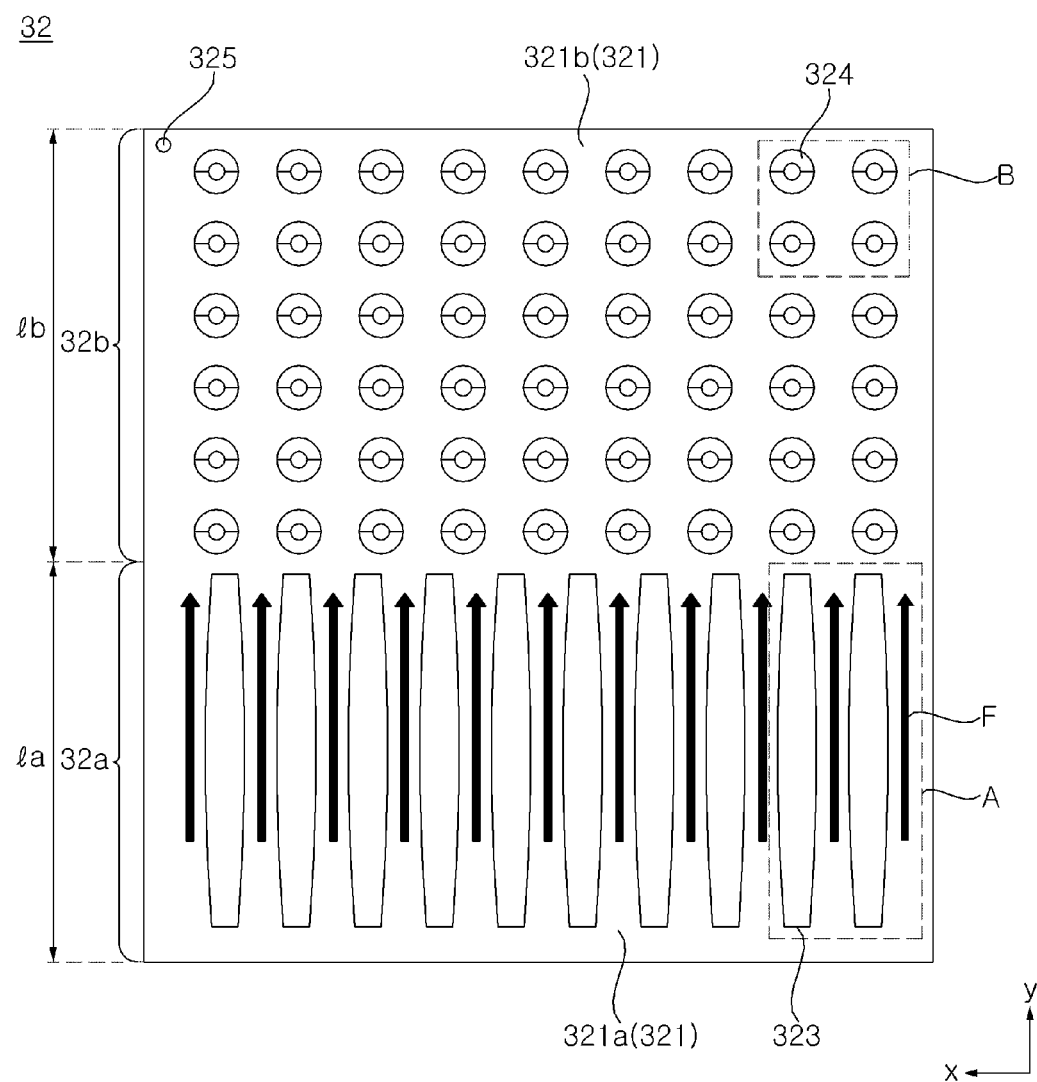

Referring to FIG. 7, the second body 321 of the second plate 32 may have a hole 325, through which the fluid W is supplied into the space S (see FIG. 5). For example, after the fluid W is supplied into the space S through the hole 325, the space S may be evacuated using a vacuum device (not shown). For example, a copper pipe (not shown) may be fitted into the hole 325 so as to allow the fluid W to flow therethrough.

A plurality of recesses 323 and 324 may be depressed forwards from the second body 321, and may be spaced apart from each other. For example, each of the plurality of recesses 323 and 324 may be configured to have the shape of an embossment. The plurality of recesses 323 and 324 may be positioned close to the rear surface of the first plate 31, or may be in contact with the rear surface of the first plate 31. Consequently, the space S may be defined between the remaining region of the second plate 32 excluding the plurality of recesses 323 and 324 and the first plate 31.

The plurality of recesses 323 and 324 may prevent the first plate 31 and the second plate 32 from coming into close contact with each other while the space S is evacuated.

Referring again to FIGS. 3 and 7, the second plate 32 may include a lower plate 32a and an upper plate 32b.

The lower plate 32a may face the board 50. The upper plate 32b may extend in the vertical direction UD from the lower plate 32a. For example, the board 50 may be mounted on the vapor chamber 30 adjacent to the lower end of the vapor chamber 30. Here, the lower plate 32a may be positioned under the upper plate 32b, and the upper plate 32b may extend upwards from the lower plate 32a. The length 1a of the lower plate 32a in the vertical direction UD may be equal to or less than the length 1b of the upper plate 32b in the vertical direction UD. For example, the vertical length 1a of the lower plate 32a may be equal to the vertical length of the back cover 40.

Accordingly, the region of the vapor chamber 30 in which the lower plate 32a is positioned may be positioned behind the display panel, and may be positioned in front of the board 50. Meanwhile, the region of the vapor chamber 30 in which the upper plate 32b is positioned may be positioned behind the display panel 10. In other words, a larger amount of heat may be transmitted to the region of the vapor chamber 30 in which the lower plate 32a is positioned than to the region of the vapor chamber 30 in which the upper plate 32b is positioned.

The plurality of recesses 323 and 324 may include a plurality of first recesses 323 and a plurality of second recesses 324. The plurality of first recesses 323 may be positioned at the lower plate 324, and may each have a first shape. The plurality of second recesses 324 may be positioned at the upper plate 32b, and may each have a second shape different from the first shape.

Figure 8:
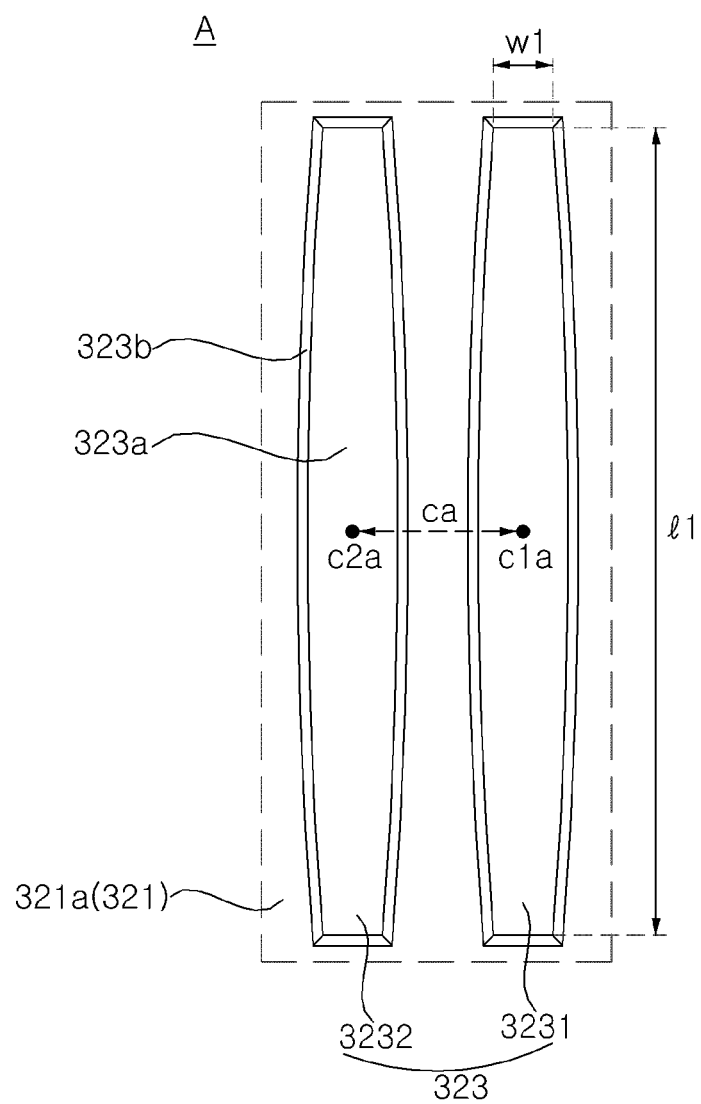
Figure 10:
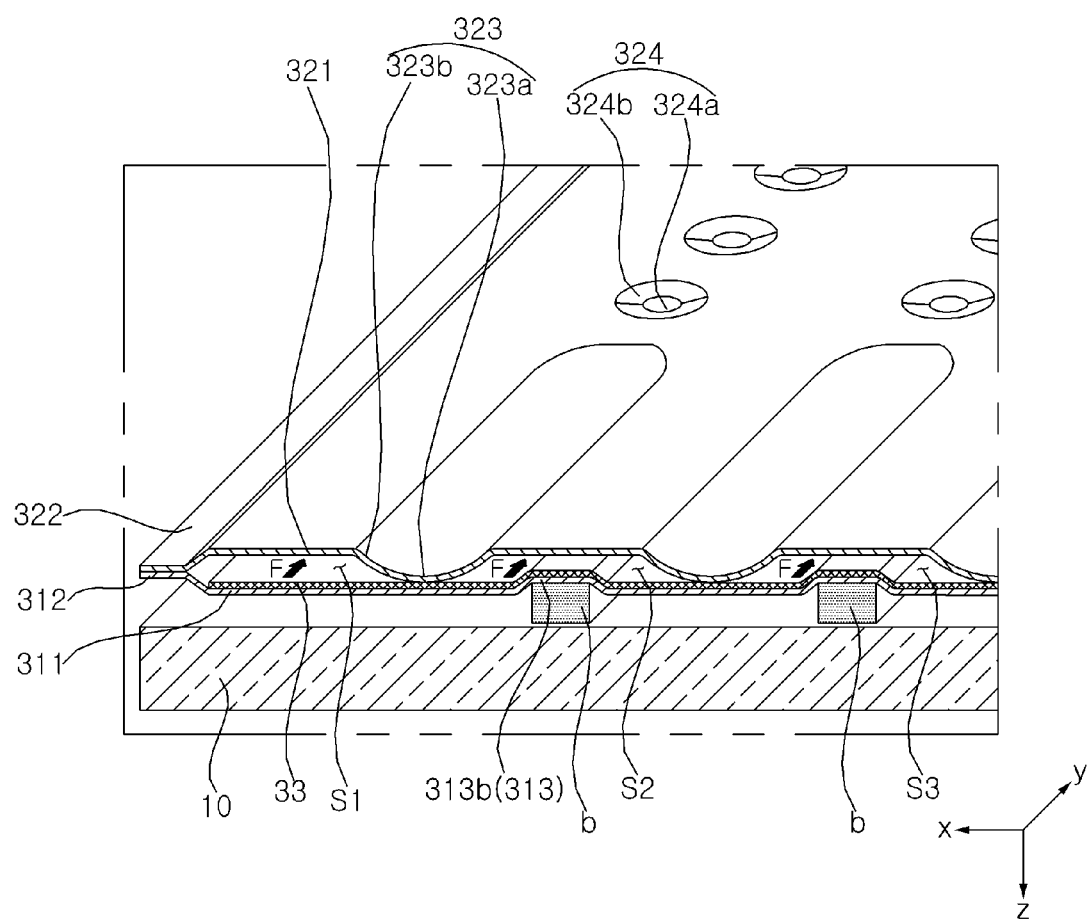

Referring to FIGS. 8 and 10, the plurality of first recesses 323 may be spaced apart from each other in the lateral direction LR, and may extend in the vertical direction UD to partition the space S into a plurality of spaces S1, S2 and S3. Here, the plurality of spaces S1, S2 and S3 may extend along the plurality of first recesses 323 in the vertical direction UD.

Specifically, each of the plurality of first recesses 323 may include a first flat portion 323a and a first sloping portion 323b. The first flat portions 323a may be in contact with or close to the first body 311 of the first plate 31 so as to partition the space S defined by the lower plate 32a into the plurality of spaces S1, S2 and S3. For example, each of the flat portions 323a may be configured to have a rectangular shape overall. Each of the first sloping portions 323b may connect the second body 321a of the second plate 32 to the first flat portion 323a. The first sloping portion 323b may be inclined at an obtuse angle with respect to the first flat portion 323a.

One 3231 of the plurality of first recesses 323 may have the same shape as that of another first recess 3232 adjacent to the one first recess 3231. In other words, the first flat portion 323a of each of the plurality of first recesses 323 may have a length l1 in the vertical direction UD and a width w1 in the lateral direction LR.

The plurality of first recesses 323 may be arranged at the same interval in the lateral direction LR. The interval may be defined as the distance ca between the center c1a of one 3231 of the plurality of first recesses 323 and the center c2a of another first recess 3232 adjacent to the first recess 3231.

Accordingly, when the fluid W in the region of the vacuum chamber 30 in which the lower plate 32a is positioned is evaporated using the heat generated from the display panel 10 and the board 50 (see FIG. 3), the fluid W may flow upwards along the plurality of spaces S1, S2 and S3 (see arrows F in FIG. 10). Compared to the case in which the evaporated fluid W flows not only upwards but also leftwards or rightwards, the evaporated fluid W may quickly move from the region in which the lower plate 32a is positioned to the region in which the upper plate 32b, to which a relatively small amount of heat is transmitted, is positioned. In other words, since cooling is efficiently performed in the region in which the lower plate 32a, to which a relatively large amount of heat is transmitted, is positioned, it is possible to prevent occurrence of local hot spot.

Figure 9:
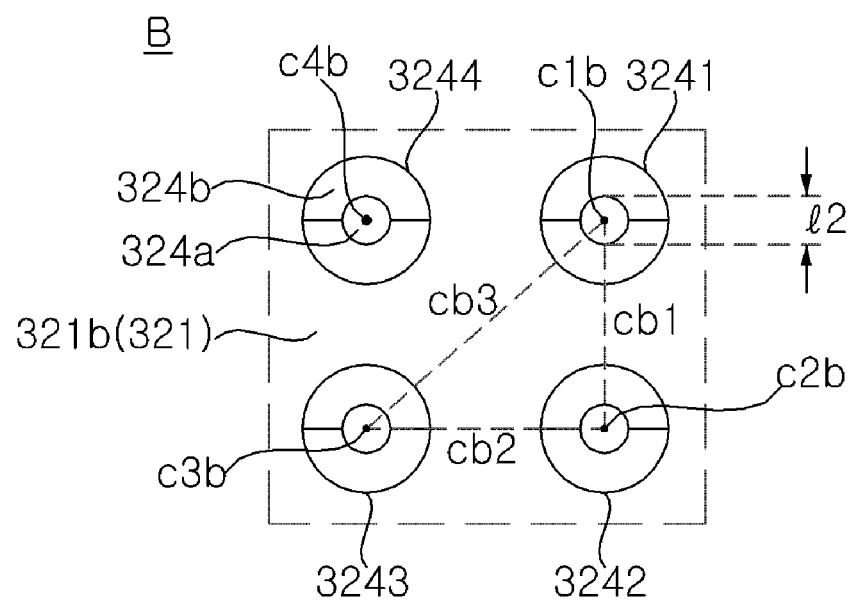

Referring to FIGS. 9 and 10, the plurality of second recesses 324 may be spaced apart from each other both in the vertical direction UD and in the lateral direction LR. Here, the plurality of second recesses 324 may be spaced apart from each other by a distance smaller than the length of each of the plurality of first recesses 323 or the length l1 of the first flat portion 323a.

Specifically, each of the plurality of second recesses 324 may include a second flat portion 324a and a second sloping portion 324b. The second flat portion 324a may be in contact with or close to the first body 311 of the first plate 31. For example, the second flat portion 324a may be configured to have a circular shape overall. The second sloping portion 324b may connect the second body 321b of the second plate 32 to the second flat portion 324a. The second sloping portion 324b may be inclined at an obtuse angle with respect to the second flat portion 324a.

One 3241 of the plurality of second recesses 324 may have the same shape as that of another second recess 3242 adjacent to the second recess 3241. In other words, the diameter of the second flat portion 324a of each of the plurality of second recesses 324 may be l2.

The plurality of second recesses 324 may be arranged at the same interval both in the vertical direction UD and in the lateral direction LR. The interval in the vertical direction UD may be defined as the distance cb1 between the center c1b of one 3241 of the plurality of second recesses 324 and the center c2b of another second recess 3242 adjacent to the second recess 3241 in the vertical direction UD. The interval in the lateral direction LR may be defined as the distance cb2 between the center of one 3242 of the plurality of second recesses 324 and the center c3b of another second recess 3243 adjacent to the second recess 3242 in the lateral direction LR. The interval between two second recesses 324 adjacent to each other in the diagonal direction may be defined as the distance cb3 between the center c1b of one 3241 of the plurality of second recesses 324 and the center c3b of another second recess 3243 adjacent to the second recess 3241 in the diagonal direction. Here, any of the distance cb1, cb2 and cb3 and the diameter l2 may be smaller than the length l1.

Accordingly, the space S defined by the upper plate 32b may surround the plurality of second recesses 324, and may extend in the vertical direction UD and in the lateral direction LR. Specifically, when the fluid W in the region in which the upper plate 32b is positioned is evaporated using the heat generated from the display panel 10, the fluid W flows not only in the upward direction but also in the rightward or leftward direction while radiating heat, thereby cooling the display panel 10. In other words, since the heat generated from the region of the display panel 10 in which the upper plate 32b is positioned is evenly distributed through the vapor chamber 30, it is possible to prevent the occurrence of local hot spots.

Referring to FIG. 10, a sheet 33 may be fixedly positioned between the plurality of recesses 323 and 324 and the first body 311 of the first plate 31.

The fluid W in a liquid phase may flow along the sheet 33 by capillary action. For example, the sheet 33 may include a porous material. For example, the sheet 33 may include a fibrous material. Here, the sheet 33 may be a microfilter.

Consequently, it is possible to prevent the fluid of liquid phase from remaining in the vapor chamber 30 without being evaporated. As a result, since the evaporation and condensation processes of the fluid W are efficiently performed, it is possible to efficiently cool the heating components of the display device 1, such as the display panel 10 and the board 50.

Furthermore, a mesh (not shown) may be disposed between the sheet 33 and the plurality of recesses 323 and 324. The mesh may have a plurality of voids. The mesh is capable of reducing the amount of noise that is generated when the bubbles in the fluid W, which is discharged through the sheet 33, burst. In other words, since the size of the bubbles generated when the fluid W evaporates from the sheet 33 through the plurality of voids in the mesh decreases, it is possible to eliminate the bubbles without generating large amounts of noise.

For example, the mesh may include a metal material. For example, the mesh may include stainless steel, having excellent corrosion resistance.

In accordance with an aspect of the present disclosure, provided is a display device including a display panel, a vapor chamber positioned behind the display panel, a board, which is positioned behind the vapor chamber and is coupled to the vapor chamber, and an adhesive member disposed between the display panel and the vapor chamber so as to be coupled thereto, wherein the vapor chamber includes a first plate, which defines a front surface thereof and faces the display panel, a second plate, which defines a rear surface thereof and is coupled to the first plate, and fluid flowing in a space defined between the first plate and the second plate, and wherein the first plate includes a coupler, which is depressed rearwards from the first plate and to which the adhesive member is coupled.

In accordance with another aspect of the present disclosure, the vapor chamber may cover an entire area of a rear surface of the display panel.

In accordance with another aspect of the present disclosure, the coupler may include a plurality of couplers, and the adhesive member may include a plurality of adhesive members, which are respectively coupled to the plurality of couplers.

In accordance with another aspect of the present disclosure, a front surface of the first plate may be positioned between a front surface and a rear surface of the adhesive member so as to be spaced apart from a rear surface of the display panel.

In accordance with another aspect of the present disclosure, a front surface of the first plate may be flush with a front surface of the adhesive member so as to be in contact with a rear surface of the display panel.

In accordance with another aspect of the present disclosure, the adhesive member may include a phase change material (PCM).

In accordance with another aspect of the present disclosure, the first plate may be configured to be flat with respect to the display panel.

In accordance with another aspect of the present disclosure, the second plate may include a plurality of recesses, which are depressed forwards from the second plate and are spaced apart from each other, and the space may be defined between a remaining region of the second plate, excluding the plurality of recesses and the first plate.

In accordance with another aspect of the present disclosure, the board may include a plurality of electronic elements mounted thereon, and the second plate may further include a lower plate facing the board and an upper plate extending from the lower plate in a vertical direction.

In accordance with another aspect of the present disclosure, the board may be positioned adjacent to a lower end of the vapor chamber, and the lower plate may be positioned under the upper plate, and the plurality of recesses may include a plurality of first recesses, which are positioned at the lower plate and each of which has a first shape, and a plurality of second recesses, which are positioned at the upper plate and each of which has a second shape different from the first shape.

In accordance with another aspect of the present disclosure, the plurality of first recesses may be spaced apart from each other in a lateral direction, and may extend in a vertical direction so as to partition the space into a plurality of spaces.

In accordance with another aspect of the present disclosure, each of the plurality of first recesses may be formed such that one end thereof is close to a lower end of the lower plate and a remaining end thereof is close to an upper end of the lower plate.

In accordance with another aspect of the present disclosure, the plurality of first recesses may be spaced apart from each other in the vertical direction and in the lateral direction by a distance less than a length of each of the first recesses.

In accordance with another aspect of the present disclosure, each of the plurality of first recesses may have a rectangular rear surface, and each of the plurality of second recesses may have a circular rear surface.

In accordance with another aspect of the present disclosure, the vapor chamber may further include a porous sheet positioned between the plurality of recesses and the first plate.

The effects of the display device according to the present disclosure will be described.

At least one embodiment of the present disclosure provides a display device capable of preventing the temperature of a display panel from excessively increasing.

At least one embodiment of the present disclosure provides a vapor chamber capable not only of cooling the display panel but also of ensuring a desired rigidity of the display device.

At least one embodiment of the present disclosure provides a display device capable of minimizing the distance between the vapor chamber and the display panel to allow heat generated from the display panel to be easily transmitted to the vapor chamber.

At least one embodiment of the present disclosure provides a display device capable of allowing the fluid evaporated from a region of the vapor chamber in which a relatively large amount of heat is absorbed to quickly flow to the heat radiation portion to efficiently cool the display panel.

Certain embodiments or other embodiments of the disclosure described above are not mutually exclusive, or are distinct from each other. Any or all elements of the embodiments of the disclosure described above may be combined with each other in configuration or function.

For example, a configuration "A" described in one embodiment of the disclosure and the drawings and a configuration "B" described in another embodiment of the disclosure and the drawings may be combined with each other. That is, even if the combination of the configurations is not directly described, the combination is possible except in cases where it is described that the combination is impossible.

Although embodiments have been described with reference to a number of illustrative embodiments thereof, it should be understood that numerous other modifications and embodiments that fall within the scope of the principles of this disclosure can be devised by those skilled in the art. More particularly, various variations and modifications are possible in the component parts and/or arrangements within the scope of the disclosure, the drawings and the appended claims. In addition to variations and modifications in the component parts and/or arrangements, alternative uses will also be apparent to those skilled in the art.

What is claimed is:

1. A display device comprising:
a display panel;
a vapor chamber positioned behind the display panel;
a board, which is positioned behind the vapor chamber and is coupled to the vapor chamber; and
an adhesive member disposed between the display panel and the vapor chamber so as to be coupled thereto,
wherein the vapor chamber comprises:
a first plate, which defines a front surface thereof and faces the display panel;
a second plate, which defines a rear surface thereof and is coupled to the first plate; and
fluid flowing in a space defined between the first plate and the second plate,
wherein the first plate comprises a coupler, which is depressed rearwards from the first plate and to which the adhesive member is coupled,
wherein the second plate comprises a plurality of recesses, which are depressed forwards from the second plate and are spaced apart from each other, and
wherein the space is defined between a remaining region of the second plate excluding the plurality of recesses and the first plate.

2. The display device according to claim 1, wherein the vapor chamber covers an entire area of a rear surface of the display panel.

3. The display device according to claim 1, wherein the coupler comprises a plurality of couplers, and the adhesive member comprises a plurality of adhesive members, which are respectively coupled to the plurality of couplers.

4. The display device according to claim 1, wherein a front surface of the first plate is positioned between a front surface and a rear surface of the adhesive member so as to be spaced apart from a rear surface of the display panel.

5. The display device according to claim 1, wherein a front surface of the first plate is flush with a front surface of the adhesive member so as to be in contact with a rear surface of the display panel.

6. The display device according to claim 1, wherein the adhesive member comprises a phase change material (PCM).

7. The display device according to claim 1, wherein the first plate is configured to be flat with respect to the display panel.

8. The display device according to claim 1, wherein the board comprises a plurality of electronic elements mounted thereon, and
wherein the second plate further comprises:
a lower plate facing the board; and
an upper plate extending from the lower plate in a vertical direction.

9. The display device according to claim 8, wherein the board is positioned adjacent to a lower end of the vapor chamber, and the lower plate is positioned under the upper plate, and
wherein the plurality of recesses comprises:
a plurality of first recesses, which are positioned at the lower plate and each of which has a first shape; and
a plurality of second recesses, which are positioned at the upper plate and each of which has a second shape different from the first shape.

10. The display device according to claim 9, wherein the plurality of first recesses are spaced apart from each other in a lateral direction and extend in a vertical direction so as to partition the space into a plurality of spaces.

11. The display device according to claim 10, wherein each of the plurality of first recesses is positioned such that one end thereof is close to a lower end of the lower plate and a remaining end thereof is close to an upper end of the lower plate.

12. The display device according to claim 10, wherein the plurality of first recesses are spaced apart from each other in the vertical direction and in the lateral direction by a distance less than a length of each of the first recesses.

13. The display device according to claim 10, wherein each of the plurality of first recesses has a rectangular rear surface and each of the plurality of second recesses has a circular rear surface.

14. The display device according to claim 1, wherein the vapor chamber further comprises a porous sheet positioned between the plurality of recesses and the first plate.

* * * * *